(12) United States Patent
Orlowski et al.

(10) Patent No.: US 7,364,970 B2
(45) Date of Patent: Apr. 29, 2008

(54) METHOD OF MAKING A MULTI-BIT NON-VOLATILE MEMORY (NVM) CELL AND STRUCTURE

(75) Inventors: Marius K. Orlowski, Austin, TX (US); Sinan Goktepeli, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 265 days.

(21) Appl. No.: 11/240,242

(22) Filed: Sep. 30, 2005

(65) Prior Publication Data

US 2007/0077706 A1 Apr. 5, 2007

(51) Int. Cl.
*H01L 21/8247* (2006.01)
(52) U.S. Cl. ................. 438/267; 257/E21.179
(58) Field of Classification Search ........ 438/257–267; 257/E21.179
See application file for complete search history.

(56) References Cited

U.S. PATENT DOCUMENTS

| | | | |
|---|---|---|---|
| 6,011,725 A | 1/2000 | Eitan | |
| 6,330,184 B1 | 12/2001 | White et al. | |
| 6,417,049 B1 * | 7/2002 | Sung et al. | 438/266 |
| 6,492,228 B2 | 12/2002 | Gonzalez et al. | |
| 6,706,599 B1 | 3/2004 | Sadd et al. | |

\* cited by examiner

*Primary Examiner*—Richard A. Booth
(74) *Attorney, Agent, or Firm*—James L. Clingan, Jr.; David G. Dolezal

(57) ABSTRACT

A multi-bit non volatile memory cell includes a first floating gate sidewall spacer structure and a second floating gate sidewall spacer structure physically separated from the first floating gate sidewall spacer structure. Each floating gate sidewall spacer structure stores charge for logically storing a bit. The floating gate sidewall spacer structures are formed adjacent to a patterned structure by sidewall spacer formation processes from a layer of floating gate material (e.g. polysilicon). A control gate is formed over the floating gate sidewall spacer structures by forming a layer of control gate material and then patterning the layer of control gate material.

12 Claims, 6 Drawing Sheets

METHOD OF MAKING A MULTI-BIT NON-VOLATILE MEMORY (NVM) CELL AND STRUCTURE

FIELD OF THE INVENTION

This invention relates to NVM cells, and more particularly to NVM cells that have more than one bit.

BACKGROUND OF THE INVENTION

Multi-bit non-volatile memory (NVM) cells have the benefit of more bits per unit of die area so are very attractive for that reason. A single NVM cell that stores multi-bits typically stores two bits. The storage for one bit is near one source/drain and the other bit is near the other source/drain. Nitride storage is attractive for this purpose because the stored electrons are relatively immobile within the nitride film. A layer of nanocrystals has the same characteristic in that the electrons are contained within a given nanocrystal so they don't move from nanocrystal to nanocrystal. Nanocrystals and nitride, however, are relatively unproven in manufacturing.

Polysilicon floating gates are proven as being effective in manufacturing NVMs, but electrons are free to move within the polysilicon layer that forms the floating gate. This prevents the electrons from being maintained just in proximity to one source/drain or the other.

Thus, there is a need for a more manufacturable multi-bit NVM cell.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a multi-bit memory cell has a first polysilicon storage area near one source/drain region and second polysilicon storage area near the other source/drain region. The two polysilicon storage areas are made in the manner of sidewall spacers adjacent to a dielectric region. The control gate is deposited over the two polysilicon storage areas and patterned to form a gate stack in which the same control gate is over both polysilicon storage areas. A dielectric layer is formed between the control gate and the two polysilicon storage areas. The gate stack is used as a mask for source/drain formation. This is better understood by reference to the drawings and the following description.

Figure 1:
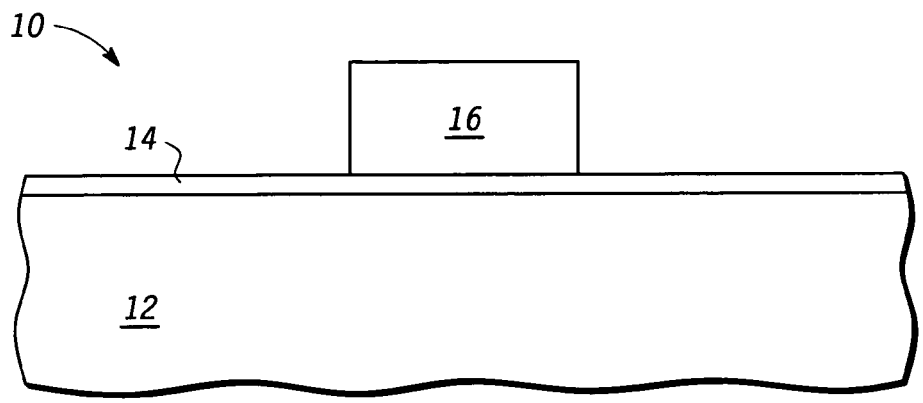
FIG. 1 is a cross section of a semiconductor device at a stage in a process that is according to an embodiment of the invention.

Shown in FIG. 1 is a semiconductor device structure 10 having a substrate 12, a gate dielectric 14, and a patterned layer 16. Substrate 12 is shown as bulk silicon but could also be SiO and also could be a different semiconductor material than silicon. Gate dielectric is preferably silicon oxide but could be another material. Of particular likelihood in the future is a high K dielectric such as a metal oxide. Patterned layer 16 in this described example is formed by depositing a layer of silicon nitride and then performing a patterned etch using photoresist for the pattern. Another material, especially a dielectric, could also be used for layer 16. The dimensions of patterned layer 16 used in this example are nominally 50 nanometers for the height and 100 nanometers for the width. These are not the smallest available dimensions so can be reduced in more aggressive memory cell designs.

Figure 2:
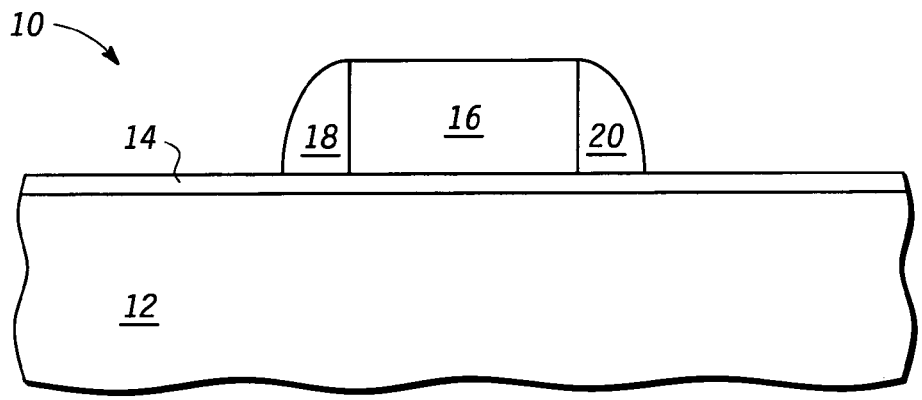
FIG. 2 is a cross section of the semiconductor at a stage in the process subsequent to that shown in FIG. 1.

Shown in FIG. 2 is semiconductor device structure 10 after formation of sidewall spacers 18 and 20 around patterned layer 16. Sidewall spacers 18 and 20 are formed in conventional sidewall spacer fashion by first depositing a conformal layer and then performing an anisotropic etch. This leaves sidewall spacers 18 and 20 laterally spaced apart. The distance apart is chosen by the selection of the width of patterned layer 16. The conformal layer in this example is polysilicon, which is the material that has been proven effective for floating gates in NVM cells. There may be other materials that are also effective as well.

Figure 3:
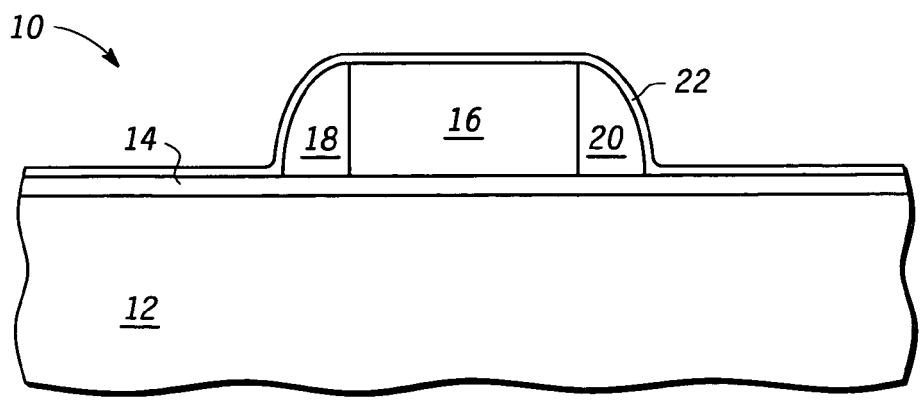
FIG. 3 is a cross section of the semiconductor at a stage in the process subsequent to that shown in FIG. 2.

Shown in FIG. 3 is semiconductor device structure 10 after forming a dielectric layer 22 on gate dielectric 14, on sidewall spacers 18 and 20, and on patterned layer 16. Dielectric layer 22 is preferably a deposited layer because it is formed over different material types and would thus be difficult to grow. This dielectric layer in this example is deposited silicon oxide that is tetraethylorthosilicate glass (TEOS). Other dielectric materials may also be used.

Figure 4:
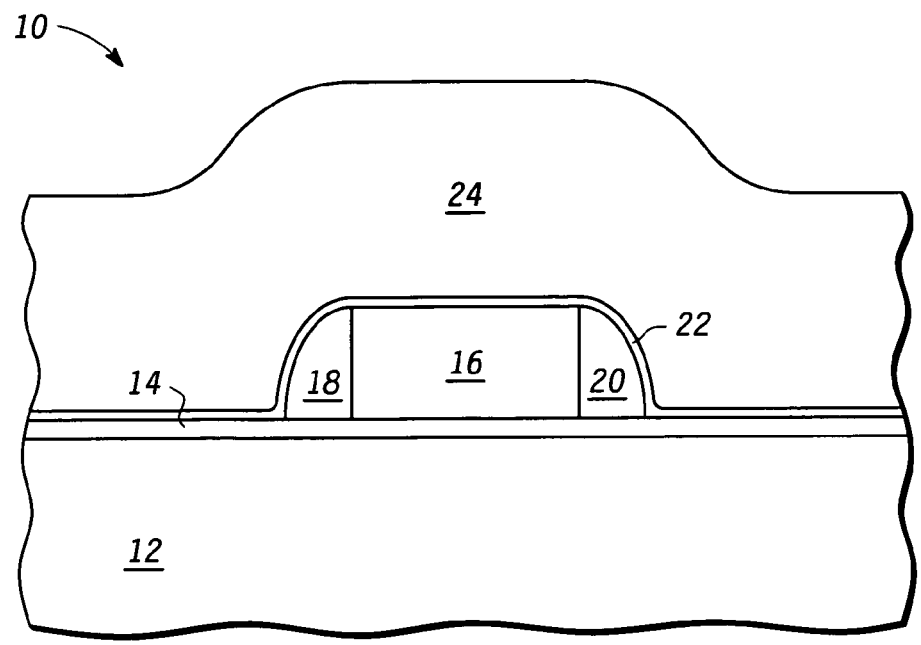
FIG. 4 is a cross section of the semiconductor at a stage in the process subsequent to that shown in FIG. 3.

Shown in FIG. 4 is semiconductor device structure 10 after depositing a layer of polysilicon 24. Layer of polysilicon 24 is blanket deposited to a thickness of about 100 nanometers.

Figure 5:
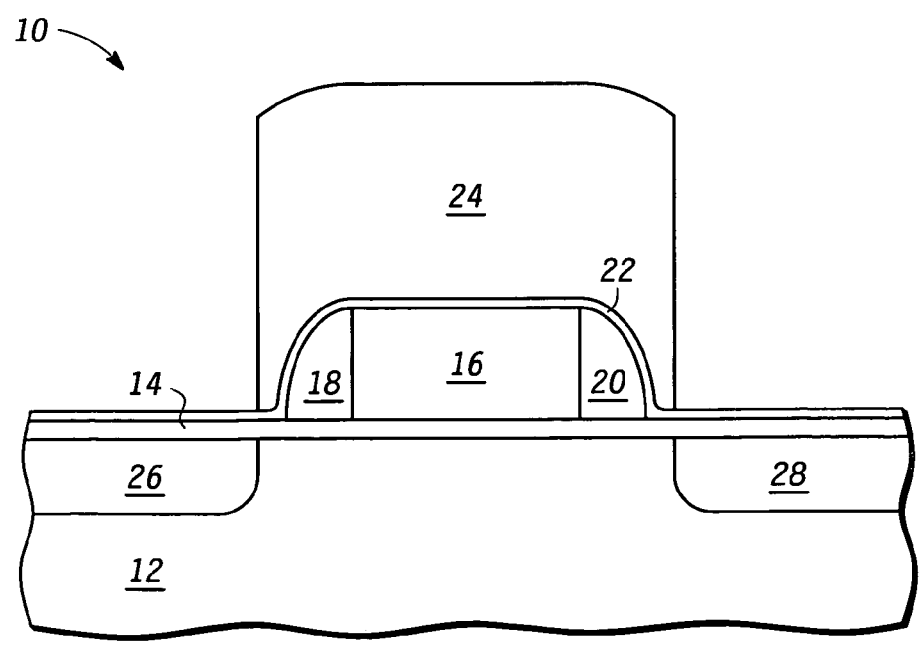
FIG. 5 is a cross section of the semiconductor at a stage in the process subsequent to that shown in FIG. 4.
Figure 6:
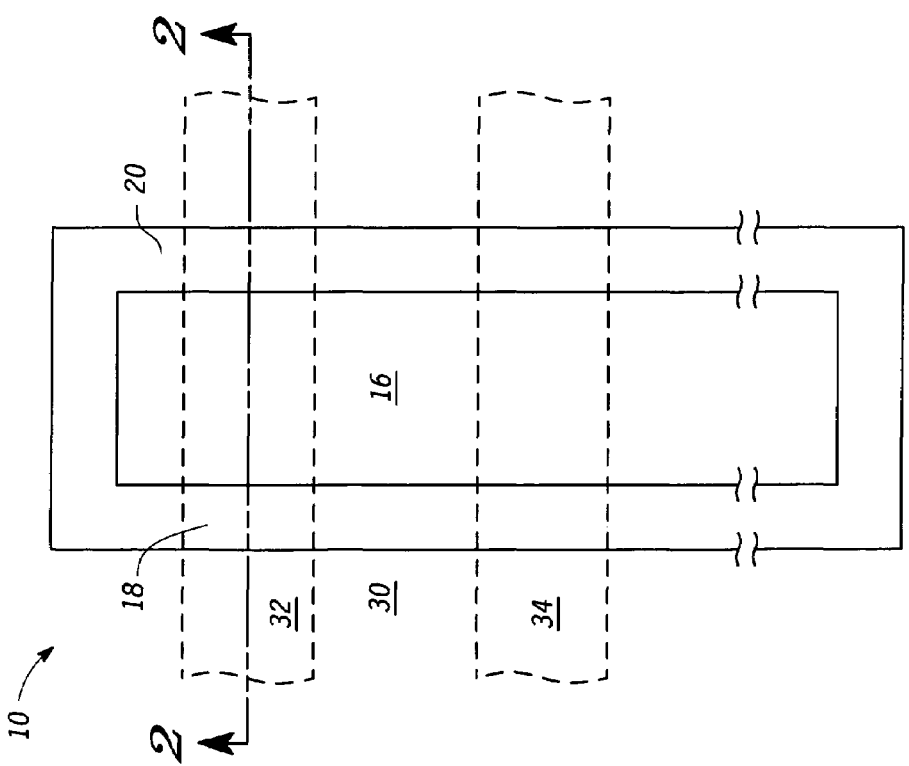
FIG. 6 is a top view of the semiconductor device at the same stage in the process as shown in FIG. 2.

Shown in FIG. 5 is semiconductor device structure 10 after patterning polysilicon layer 24 to leave polysilicon layer 24 over sidewall spacers 18 and 20 and extending just past the edges thereof. After patterning, polysilicon layer 24 and patterned layer 16 and sidewall spacers 18 and 20 form a gate stack that is useful as a mask in forming source/drain regions 26 and 28 in substrate 12 by implant. In this example semiconductor device 10 is intended for N channel operation so that source/drain regions 26 and 28 are implanted with arsenic or phosphorus. They could, however, be implanted with a different dopant. For P channel operation for example, source/drain regions 26 and 28 could be implanted with boron. This shows that source/drain region 26 is very near sidewall spacer 18 and that source/drain region 28 is very near sidewall spacer 20. Thus, sidewall spacer 18 is effective as a floating gate and can receive and store electrons when source/drain 26 is operated as a drain. Similarly, sidewall spacer 20 is very near source/drain 28 and can receive and store electrons when source/drain 28 is operated as a drain. Thus semiconductor device 10 as shown in FIG. 6 can function as an NVM cell having two bits. One bit uses sidewall spacer 18 as a floating gate for electron storage and the other bit uses sidewall spacer as a floating gate for electron storage.

One issue is that during the formation of sidewall spacers 18 and 20, the actual result is a sidewall spacer that surrounds patterned layer 16. This is shown in FIG. 6 which is a top view of semiconductor device structure 10 at the same stage in processing as shown in FIG. 2.

FIG. 6 shows sidewall spacer 18 and sidewall spacer 20 as portions of a sidewall spacer that surrounds patterned layer 16. Shown in FIG. 6 also are active regions 32 and 34 surrounded by a field region 30. Additional active regions would also be present. Patterned layer 16 is in the direction of a row a memory cells in which there would be many more memory cells. FIG. 6 also shows where the cross section of FIG. 2 is taken.

Figure 7:
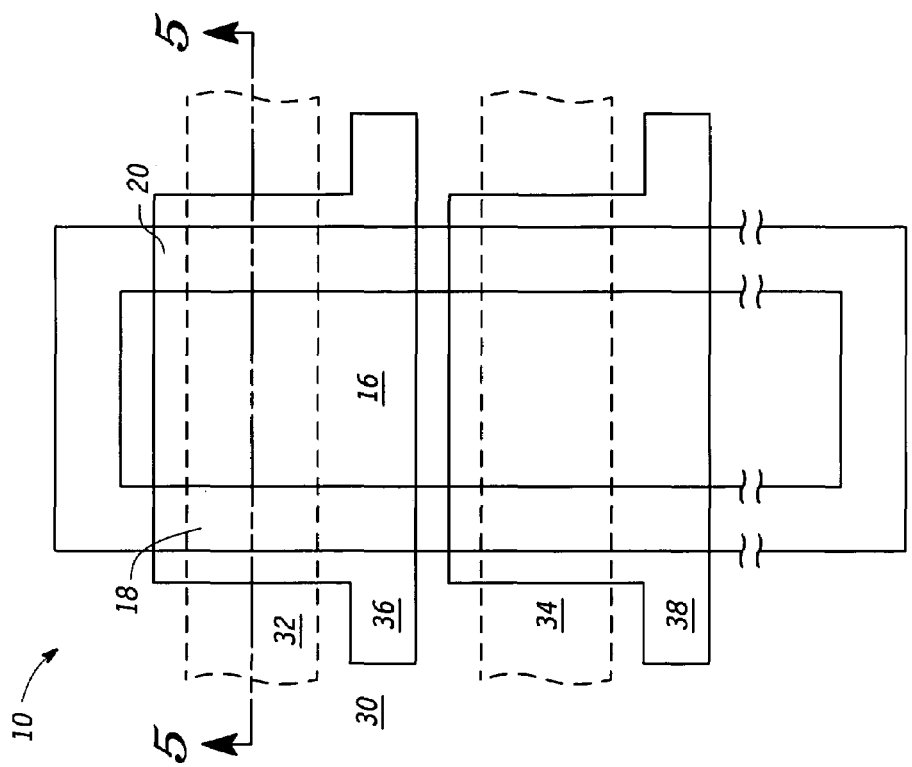
FIG. 7 is a top view of the semiconductor at a stage in the process subsequent to that shown in FIG. 6.

Shown in FIG. 7 is semiconductor device structure 10 after polysilicon layer 24 has been etched into portions 36 and 38. In FIG. 5 polysilicon layer 24, after being etched, is still shown as etched polysilicon layer 24, which is the same as polysilicon portion 36 shown in FIG. 7. FIG. 7 shows that there is a portion away from the sidewall spacer 18 where contact can be made to polysilicon portions 36 and 38. A word line, not shown, in an actual memory would contact both polysilicon portions 36 and 38. Polysilicon portions 36 and 38 are representative of the control gates for all of the memory cells along that same word line. These polysilicon portions 36 and 38 are separated from each other so that sidewall spacers 18 and 20 are exposed in the areas between memory cells. Also sidewall spacers 18 and 20 are exposed where they come together.

Figure 8:
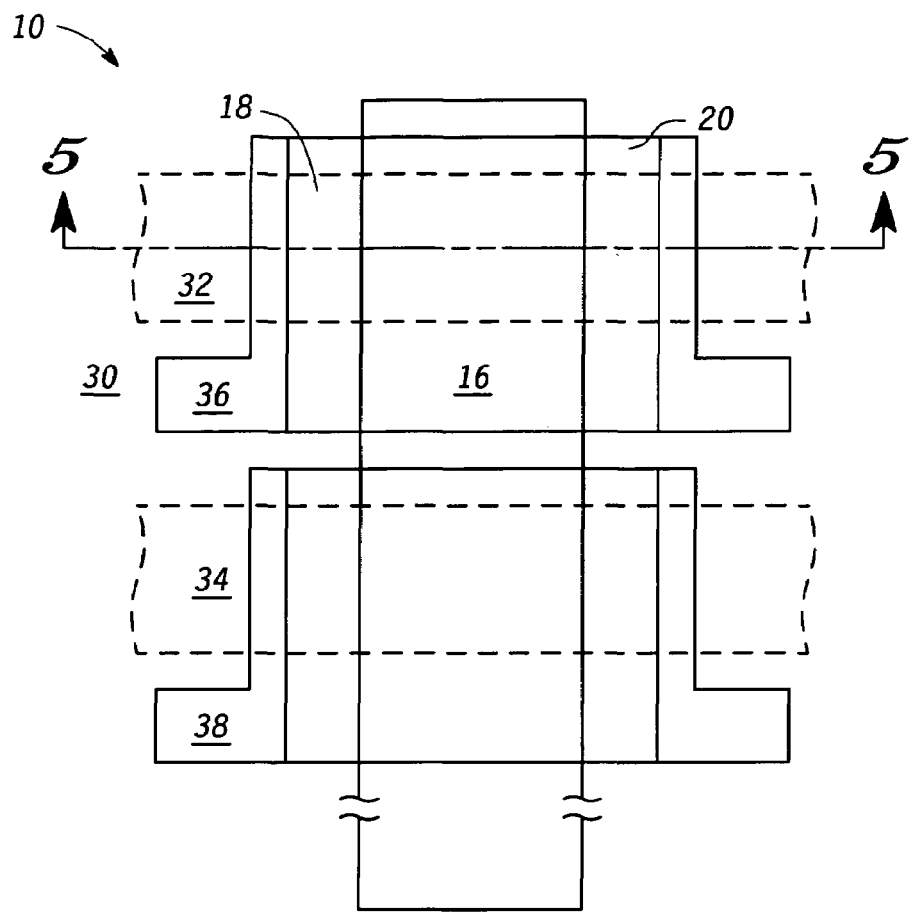
FIG. 8 is a top view of the semiconductor at a stage in the process subsequent to that shown in FIG. 7.

Shown in FIG. 8 is semiconductor device structure 10 after the sidewall spacer not covered by polysilicon portions 36 and 38 has been etched. Polysilicon portions 36 and 38 function as a mask to the etch. Thus, sidewall spacers 18 and 20 are no longer continuous but are separated from each other. This can also be viewed as the memory cell having sidewall spacers as floating gates and there being additional sidewall spacers that are removed and not part of the memory cell. Sidewall spacers 18 and 20 are also not continuous between memory cells. They are etched in the area between polysilicon portions 36 and 38 so that the floating gates of one memory cell are not connected to the floating gates of other memory cells. The source/drain implants in this example are performed after this sidewall spacer etch but could be performed prior to performing the sidewall spacer etch. The result as shown in FIGS. 5 and 8 is a memory cell with two distinct storage regions so that the memory cell actually represents two bits and the control gate controls read, write, and erase operations of the two distinct storage regions that function as floating gates.

Figure 9:
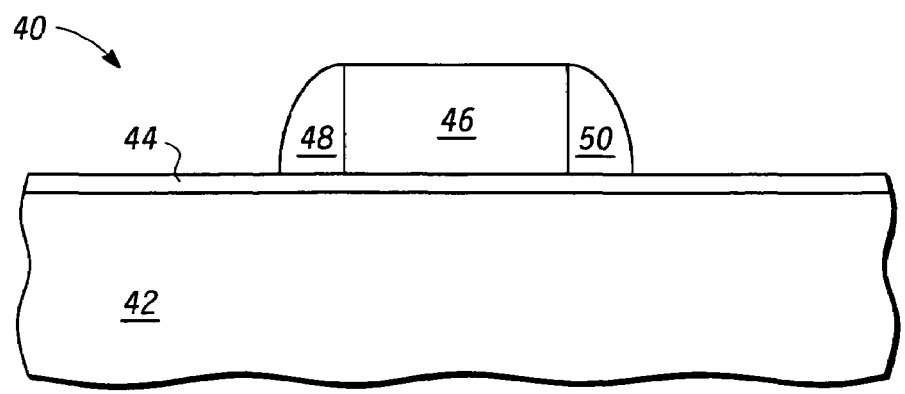
FIG. 9 is a cross section of a semiconductor device at a stage in a process that is according to an alternative embodiment of the invention.

Shown in FIG. 9 is a semiconductor device structure 40 having a substrate 42, a gate dielectric 44, a patterned layer 46, and sidewall spacers 48 and 50. This structure is made in the same way and results in the same structure as semiconductor device structure 10 of FIG. 2.

Figure 10:
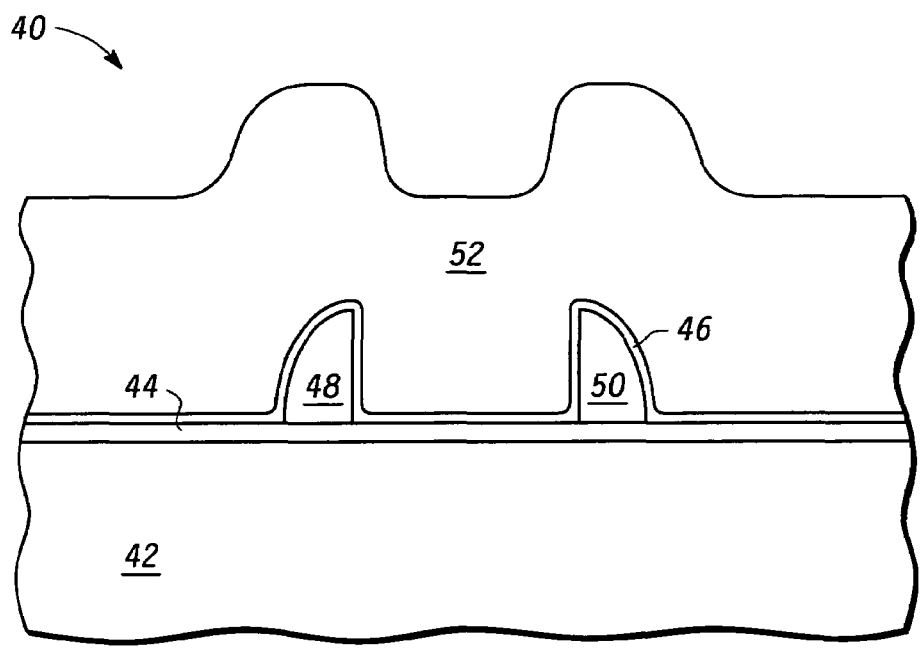
FIG. 10 is a cross section of the semiconductor at a stage in the process subsequent to that shown in FIG. 9.

Shown in FIG. 10 is semiconductor device structure 40 after removal of patterned layer 46, formation of dielectric layer 46, and the deposition of a polysilicon layer 52. Dielectric layer 46 is analogous to dielectric layer 22 of semiconductor device structure 10. Thus polysilicon layer 52 is separated from substrate 42 only by gate dielectric 44 and dielectric layer 46.

Figure 11:
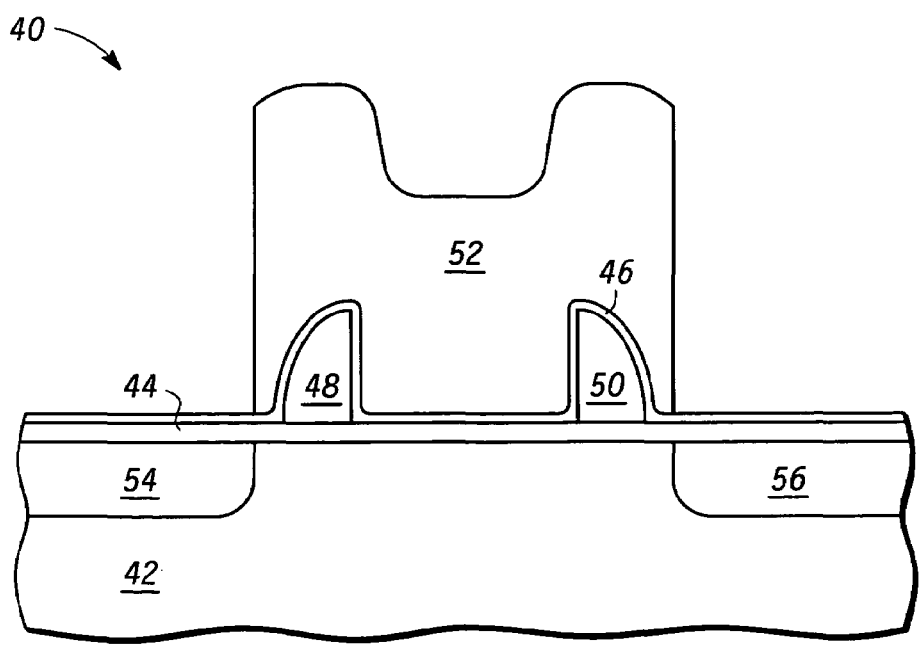
FIG. 11 is a cross section of the semiconductor at a stage in the process subsequent to that shown in FIG. 10.

Shown in FIG. 11 is shown semiconductor device structure 40 after patterning polysilicon layer 52 and implanting source/drain regions 54 and 56. Patterned polysilicon layer 52 is patterend the same as polysilicon layer 24 of semiconductor device structure 10. Source/drains 54 and 56 are thus in close proximity to sidewall spacers 48 and 50, respectively. Operationally semiconductor device structure 40 functions as a memory cell storing two bits, one in sidewall spacer 48 and the other in sidewall spacer 50. This is the same operation as for semiconductor device structure 10 except that patterned polysilicon layer 52, which functions as the control gate, has much more control on the channel region between sidewall spacers 48 and 50.

Figure 12:
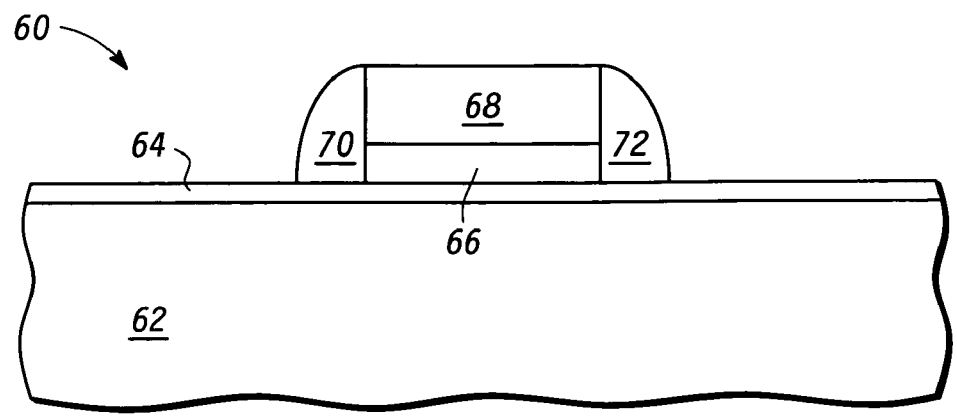
FIG. 12 is a cross section of a semiconductor device at a stage in a process that is according to another alternative embodiment of the invention.

Shown in FIG. 12 is a semiconductor device structure 60 having a substrate 62, a gate dielectric 64, a patterned layer 66, a patterned layer 68, a sidewall spacer 70, and a sidewall spacer 72. In this case patterned dielectric layers 66 and 68 are of different materials from each other but together are otherwise substantially analogous to patterned layers 16 and 46 of semiconductor device structures 10 and 40, respectively. They are deposited, etched to the pattern shown in FIG. 12, and have sidewall spacers 70 and 72 formed on the sides by depositing polysilicon and performing an anisotropic etch. In this example, patterned layer 66 is oxide and patterned layer 68 is nitride but they could be other materials.

Figure 13:
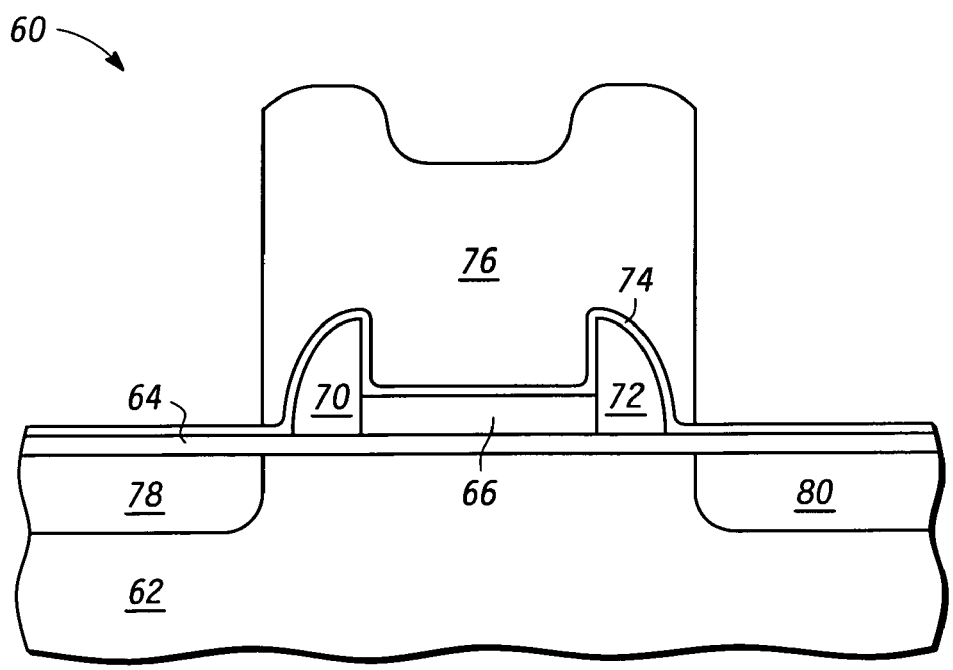
FIG. 13 is a cross section of the semiconductor at a stage in the process subsequent to that shown in FIG. 12.

Shown in FIG. 13 is semiconductor device structure 60 after removing patterned layer 68 by an etch, depositing a polysilicon layer 76, and selectively etching polysilicon layer 76 to form patterned polysilicon layer 76. The etch of patterned layer 68 does not require a mask because the material of patterned layer 68 is chosen to be selectively etchable to patterned layer 66. Patterned polysilicon layer 76 is first deposited as a blanket layer and then patterned the same as polysilicon layer 24 of semiconductor device structure 10 and polysilicon layer 52 of semiconductor device structure 40. The main difference in semiconductor device structure 60 is that the coupling from the control gate to the channel of the memory cell in the area between sidewall spacers 78 and 80 is selectable by choosing the thickness, which is also the height, of patterned layer 66.

Thus, semiconductor device structures 10, 40, and 60 utilize the desirable polysilicon floating gate for storage to provide an NVM cell that represents multiple bits. Further the individual processing steps are not particularly difficult.

Various other changes and modifications to the embodiments herein chosen for purposes of illustration will readily occur to those skilled in the art. For example, the material chosen for patterned layer 68 could be a conductive material instead of a dielectric material.

To the extent that such modifications and variations do not depart from the spirit of the invention, they are intended to be included within the scope thereof which is assessed only by a fair interpretation of the following claims.

The invention claimed is:

1. A method for forming a semiconductor device comprising:
   forming first structure over a substrate;
   forming a first floating gate sidewall spacer structure adjacent to a first side wall of the first structure and a second floating gate sidewall spacer structure adjacent to a second sidewall of the first structure; and forming a control gate structure over the first floating gate sidewall spacer structure and over the second floating gate sidewall spacer structure;

wherein the forming the first floating gate sidewall spacer structure and the second floating gate sidewall spacer structure includes forming a third sidewall spacer structure surrounding the first structure, wherein the third sidewall spacer structure includes the first floating gate sidewall spacer structure and the second floating gate sidewall spacer structure.

2. The method of claim 1 wherein the forming the control gate includes:

forming a layer of control gate material over the substrate including over the third sidewall spacer structure;

patterning the layer of control gate material to form the control gate structure;

wherein the patterning the layer of control gate material includes removing portions of the third sidewall spacer structure to physically separate the first floating gate sidewall spacer structure and the second floating gate sidewall spacer structure.

3. The method of claim 1 further comprising:

removing portions of the third sidewall spacer structure to physically separate the first floating gate sidewall spacer structure and the second floating gate sidewall spacer structure.

4. The method of claim 1 further comprising:

removing the first structure prior to the forming the control gate structure.

5. The method of claim 1 further comprising:

removing a first portion of the first structure prior to the forming the control gate structure wherein a second portion of the first structure remains;

wherein the forming the control gate structure includes forming the control gate structure over the second portion after the removing the first portion.

6. The method of claim 5 wherein the first structure includes a layer of a first material over a layer of a second material, wherein the first portion is the layer of the first material and the second portion is the layer of the second material.

7. The method of claim 1 wherein the first structure includes dielectric material.

8. The method of claim 1 wherein the first floating gate sidewall spacer structure and the second floating gate sidewall spacer structure include polysilicon.

9. The method of claim 1 wherein the semiconductor device includes a non volatile memory cell including a control gate, a first floating gate, and a second floating gate, wherein:

the control gate includes the control gate structure;

the first floating gate includes the first floating gate sidewall spacer structure;

the second floating gate includes the second floating gate sidewall spacer structure;

the first floating gate is configured to store charge for storing a first logical bit;

the second floating gate is configured to store charge for storing a second logical bit;

wherein the control gate controls read, write, and erase operations of the first floating gate and the second floating gate.

10. A method of forming a semiconductor device, the method comprising:

forming a first structure over a substrate, the first structure including a first sidewall and a second sidewall opposing the first sidewall;

forming a layer of floating gate material over the substrate and over the first structure;

anisotropically etching the layer of floating gate material, wherein the anisotropically etching leaves a first sidewall spacer structure of the floating gate material adjacent to the first sidewall and a second sidewall spacer structure of the floating gate material adjacent to the second sidewall;

forming a layer of control gate material over the substrate, the first sidewall spacer structure, and the second sidewall spacer structure;

patterning the layer of control gate material, wherein the patterning leaves a control gate structure including a first portion over the first sidewall spacer structure and a second portion over the second sidewall spacer structure;

wherein the anisotropically etching leaves a third sidewall spacer structure surrounding the first structure, the third sidewall spacer structure including the first sidewall spacer structure and the second sidewall spacer structure, the method further comprising:

removing portions of the third sidewall spacer structure to physically separate the first sidewall spacer structure and the second sidewall spacer structure.

11. The method of claim 10 wherein the removing portions is performed during the patterning of the layer of control gate material.

12. The method of claim 10 further comprising:

forming a layer of dielectric material over the first sidewall spacer structure and over the second sidewall spacer structure prior to the forming the layer of control gate material.

* * * * *